US012672245B2

(12) United States Patent
Li

(10) Patent No.: US 12,672,245 B2
(45) Date of Patent: Jun. 30, 2026

(54) DISPLAY PANEL SUB-ASSEMBLY AND TILED DISPLAY APPARATUS

(71) Applicants: BOE MLED Technology Co., Ltd., Beijing (CN); BOE TECHNOLOGY GROUP CO., LTD., Beijing (CN)

(72) Inventor: Zhonghua Li, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 106 days.

(21) Appl. No.: 18/702,412

(22) PCT Filed: May 10, 2023

(86) PCT No.: PCT/CN2023/093157
§ 371 (c)(1),
(2) Date: Apr. 18, 2024

(87) PCT Pub. No.: WO2023/246351
PCT Pub. Date: Dec. 28, 2023

(65) Prior Publication Data
US 2025/0107017 A1    Mar. 27, 2025

(30) Foreign Application Priority Data

Jun. 24, 2022    (CN) ......................... 202210722958.6

(51) Int. Cl.
*H05K 5/02*      (2006.01)
*H05K 5/30*      (2025.01)

(52) U.S. Cl.
CPC ............. *H05K 5/0217* (2013.01); *H05K 5/30* (2025.01)

(58) Field of Classification Search
CPC ...... H05K 5/0217; H05K 5/30; G09F 9/3026; G09F 9/33
See application file for complete search history.

(56) References Cited

U.S. PATENT DOCUMENTS

| | | | | | |
|---|---|---|---|---|---|
| 10,626,961 | B2 * | 4/2020 | Heo | ........................... | G09F 9/33 |
| 12,396,106 | B2 * | 8/2025 | Park | .................... | H05K 5/0217 |
| 2010/0246147 | A1 * | 9/2010 | Qin | ...................... | H05K 5/0217 |
| | | | | | 361/758 |

(Continued)

FOREIGN PATENT DOCUMENTS

| | | |
|---|---|---|
| CN | 205722609 U | 11/2016 |
| CN | 206478406 U | 9/2017 |

(Continued)

OTHER PUBLICATIONS

Office Action dated Dec. 9, 2024, issued in counterpart CN Application No. 202210722958.6, with English translation. (20 pages).

*Primary Examiner* — Sagar Shrestha
(74) *Attorney, Agent, or Firm* — WHDA, LLP

(57) ABSTRACT

The present disclosure provides a display panel sub-assembly and a tiled display apparatus. The display panel sub-assembly includes a display substrate, and a mounting structure including a base plate disposed opposite to the display substrate, and at least one position adjusting structure extending through the base plate and connected to the display substrate, the at least one position adjusting structure being configured to adjust a relative position between the display substrate and the base plate.

17 Claims, 6 Drawing Sheets

(56)        References Cited

U.S. PATENT DOCUMENTS

| | | | | |
|---|---|---|---|---|
| 2016/0210886 | A1* | 7/2016 | Brashnyk | G09F 9/33 |
| 2017/0006727 | A1* | 1/2017 | Ryu | H01L 25/0753 |
| 2019/0295459 | A1 | 9/2019 | Gou et al. | |
| 2019/0372507 | A1 | 12/2019 | Kobayashi | |
| 2020/0337160 | A1 | 10/2020 | Hsiao | |
| 2021/0033240 | A1* | 2/2021 | Choi | F16M 11/046 |
| 2021/0076115 | A1* | 3/2021 | Choi | H04R 1/028 |
| 2022/0007525 | A1* | 1/2022 | Zhang | G02F 1/1333 |
| 2022/0157207 | A1* | 5/2022 | Yoon | H05K 1/14 |
| 2022/0198969 | A1* | 6/2022 | Wang | G09F 9/33 |

FOREIGN PATENT DOCUMENTS

| | | | | |
|---|---|---|---|---|
| CN | 109538896 | A | 3/2019 | |
| CN | 210073193 | U | 2/2020 | |
| CN | 110992848 | A | 4/2020 | |
| CN | 113450660 | A | 9/2021 | |
| CN | 113516923 | A | 10/2021 | |
| CN | 215265379 | U | 12/2021 | |
| CN | 215643475 | U | 1/2022 | |
| CN | 114008700 | A | 2/2022 | |
| CN | 114999336 | A | 9/2022 | |
| WO | WO-2021237551 | A1 * | 12/2021 | G09G 3/32 |

* cited by examiner

DISPLAY PANEL SUB-ASSEMBLY AND TILED DISPLAY APPARATUS

CROSS-REFERENCE TO RELATED APPLICATION

The present application is the U.S. national phase of International Application No. PCT/CN2023/093157 filed on May 10, 2023. International Application No. PCT/CN2023/093157 claims priority to Chinese Patent Application No. 202210722958.6 filed in China on Jun. 24, 2022. Each of the above-listed applications is hereby incorporated by reference in its entirety.

TECHNICAL FIELD

The present disclosure relates to the field of display, in particular to a display panel sub-assembly and a tiled display apparatus.

BACKGROUND

Generally, a large-sized display screen is composed of multiple display panel sub-assemblies arranged in a matrix form and spliced together, and images played by the display panel sub-assemblies are combined to form an image of the overall large-sized display screen.

The assembly process of the tiled display apparatus is as follows. Firstly, a display panel sub-assembly is obtained by assembling a display substrate and a mounting structure. Next, multiple display panel sub-assemblies are spliced and secured to the bearing housing. In practical applications, it is found that, in the process of splicing and securing multiple display panel sub-assemblies to the bearing housing, it often requires to adjust the spacing between some adjacent display substrates and the flatness of the plane where each display substrate is located. The existing adjustment process is as follows. Firstly, the assembled display panel sub-assembly is detached from the bearing housing, and the display substrate is separated from the mounting structure. Next, a relative position between the display substrate and the mounting structure is adjusted according to adjustment requirements, and the display panel sub-assembly is obtained by performing secondary assembly on the display substrate and the mounting structure, and finally the display panel sub-assembly which has finished the adjustment is secured to the bearing housing.

During the above adjustment, the display substrate and the mounting structure need to be disassembled and reassembled, which results in low assembly efficiency of the tiled display apparatus and increases the probability of damage to the display substrate.

SUMMARY

The present disclosure aims to solve at least one of the technical problems existing in the prior art, and proposes a display panel sub-assembly and a tiled display apparatus.

In a first aspect, embodiments of the present disclosure provide a display panel sub-assembly including: a display substrate; and a mounting structure including: a base plate disposed opposite to the display substrate, and at least one position adjusting structure extending through the base plate and connected to the display substrate, the at least one position adjusting structure being configured to adjust a relative position between the display substrate and the base plate.

In some embodiments, the display substrate includes: a carrier substrate, a plurality of light-emitting elements and at least one first connection member. The light-emitting element is fixed on a side of the carrier substrate away from the base plate, and the first connection member is fixed on a side of the carrier substrate close to the base plate. The at least one position adjusting structure corresponds to the at least one first connection member respectively, and one position adjusting structure is connected to a corresponding first connection member.

In some embodiments, the at least one position adjusting structure includes: at least one first fine-adjusting structure, each first fine-adjusting structure being connected to a corresponding first connection member and configured to adjust a position of the display substrate relative to the base plate in a first direction, the first direction being parallel to a normal of the carrier substrate.

In some embodiments, at least one first through hole corresponding to the at least one first fine-adjusting structure respectively is formed on the base plate. Each first fine-adjusting structure includes:

an adjusting member, at least a portion of the adjusting member being located in a corresponding first through hole, an outer side wall of the adjusting member being movably connected to an inner side wall of the corresponding first through hole, the adjusting member being configured to be movable relative to the corresponding first through hole in the first direction, the adjusting member having a hollow channel extending in the first direction; and a second connection member extending through the hollow channel, the second connection member being connected to the first connection member at an end of the second connection member close to the first connection member, an end of the second connection member away from the first connection member abutting against an end of the adjusting member away from the first connection member, and the first connection member abutting against an end of the adjusting member close to the first connection member.

In some embodiments, the first through hole is a first threaded hole, and the adjusting member includes: a hollow screw having an external thread matching an internal thread of a corresponding first threaded hole, the hollow screw being movable in the first direction by rotation in the first threaded hole.

In some embodiments, the first connection member includes: a connection pillar, one end of the connection pillar close to the carrier substrate is secured to the carrier substrate, and one end of the connection pillar away from the carrier substrate is formed with a second threaded hole. The second connection member includes: a first screw having an external thread matching an internal thread of the corresponding second threaded hole. An area of a pan head of the first screw in a cross section parallel to a plane in which the base plate lies is greater than an area of the hollow channel in a cross section parallel to the plane in which the base plate lies, and the pan head of the first screw abuts against an end of the adjusting member away from the connection pillar. An area of a shank of the first screw in a cross section parallel to the plane in which the base plate lies is smaller than the area of the hollow channel in the cross section parallel to the plane in which the base plate lies, the shank of the first screw penetrates the hollow channel, and an end of the shank of the first screw away from the first screw is threadedly connected to the corresponding connection pillar.

In some embodiments, the at least one position adjusting structure further includes: at least one second fine-adjusting structure, each second fine-adjusting structure being connected to a corresponding second connection member and configured to adjust the second connection member to move along a corresponding second direction so as to adjust the position of the display substrate relative to the base plate in the second direction. The second direction is parallel to a plane in which the carrier substrate lies.

In some embodiments, a second through hole is formed in a portion of a side wall of the adjusting member on a side of the base plate away from the display substrate, and the second fine-adjusting structure passes through the second through hole and is connected to a portion of the second connection member within the hollow channel.

In some embodiments, the portion of the second connection member located in the hollow channel is formed with a third threaded hole arranged opposite to the second through hole in the second direction. The second fine-adjusting structure includes: a second screw having an external thread matching an internal thread of the third threaded hole. A pan head of the second screw is located outside the side wall of the adjusting member. An area of a shank of the second screw in a cross section perpendicular to the second direction is smaller than an area of the second through hole in a cross section perpendicular to the second direction, the shank of the second screw passes through the second through hole and is in threaded connection with the third threaded hole, and the second screw is capable of driving the second connection member to move in the second direction by rotating in the third threaded hole.

In some embodiments, the at least one second fine-adjusting structure includes a plurality of second fine-adjusting structures, and second directions corresponding to at least two of the second fine-adjusting structures in the plurality of second fine-adjusting structures are different directions.

In some embodiments, the base plate has a first side edge, a second side edge, a third side edge and a fourth side edge. The first side edge and the second side edge are oppositely arranged in a third direction, the first side edge and the second side edge extend in a fourth direction, the third side edge and the fourth side edge are oppositely arranged in the fourth direction, and the third side edge and the fourth side edge extend in the third direction. Both the third direction and the fourth direction are parallel to the plane where the carrier substrate lies, and the third direction crosses the fourth direction. The second direction corresponding to one or more of the second fine-adjusting structures closest to the first side edge is the third direction; and/or, the second direction corresponding to one or more of the second fine-adjusting structures closest to the second side edge is the third direction; and/or, the second direction corresponding to one or more of the second fine-adjusting structures closest to the third side edge is the fourth direction; and/or, the second direction corresponding to the one or more second fine-adjusting structures closest to the fourth side edge is the fourth direction.

In some embodiments, the display panel further includes: at least one locating pin located on a side of the base plate away from the display substrate and detachably connected to the base plate, and the locating pin is configured to cooperate with a locating hole on a bearing housing, to align and assemble the display panel sub-assembly and the bearing housing.

In some embodiments, each of the at least one locating pin includes: a locating pin body and a shank connected to the locating pin body. At least one fourth threaded hole, corresponding to the at least one locating pin respectively, is formed on the base plate, and an internal thread of each fourth threaded hole matches an external thread of the shank of the corresponding locating pin.

In some embodiments, a material of the locating pin body includes plastic.

In a second aspect, the embodiments of the present disclosure further provide a tiled display apparatus including: a plurality of display panel sub-assemblies, at least one of the display panel sub-assemblies is the display panel sub-assembly provided in the first aspect.

In some embodiments, the tiled display apparatus further includes: a bearing housing configured to bear the plurality of display panel sub-assemblies.

DETAILED DESCRIPTION

Figure 1:
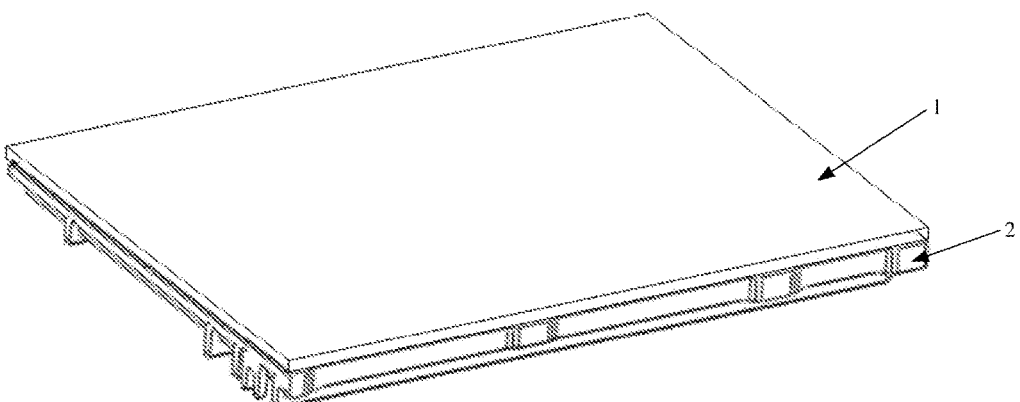
FIG. 1 is a schematic view showing a display panel sub-assembly according to the embodiments of the present disclosure.

For a better understanding of the technical aspects of the present disclosure, a detailed description will be given below with reference to the drawings and specific embodiments.

The present disclosure will be described in more detail below with reference to the accompanying drawings. In various drawings, same elements are designated with similar reference numerals. For the sake of clarity, various portions of the drawings are not provided in accordance with an actual scale. Moreover, some well-known portions may not be shown in the drawings.

Numerous specific details of the present disclosure, such as structures, materials, sizes, processing procedure and techniques of members, are described below in order to provide a clearer understanding of the present disclosure. However, as can be appreciated by those skilled in the art, the present disclosure may be not realized in accordance with these specific details.

Figure 2:
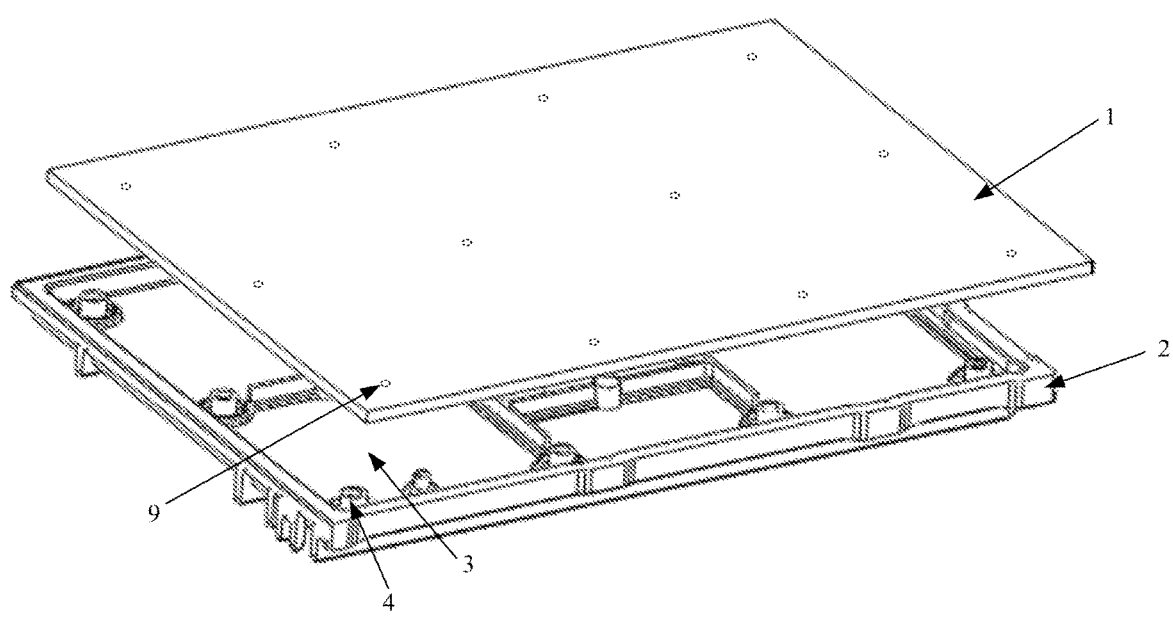
FIG. 2 is a schematic view showing a mounting structure and a display substrate before assembly according to the embodiments of the present disclosure.
Figure 3:
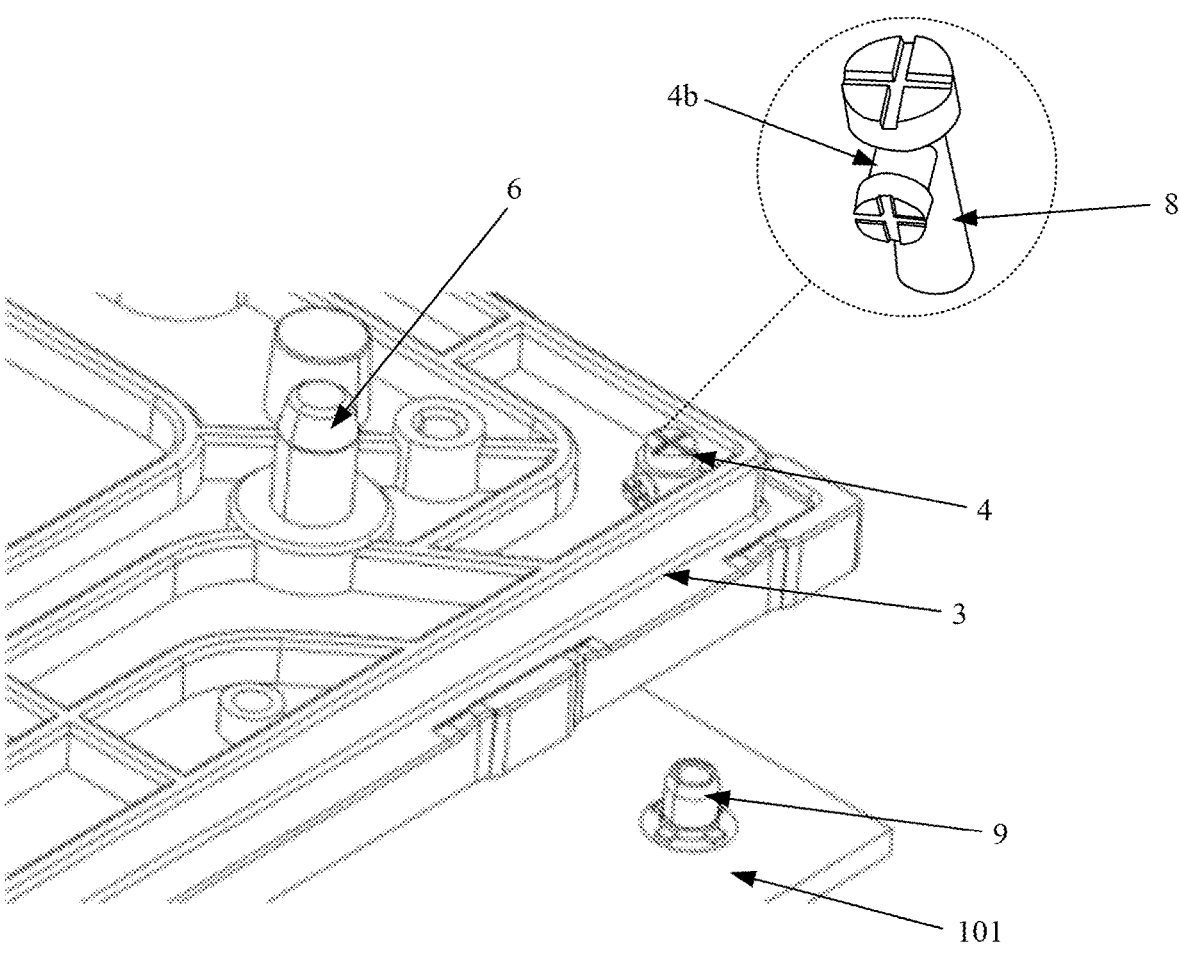
FIG. 3 is a partial rear view of the mounting structure and the display substrate before assembly.
Figure 4:
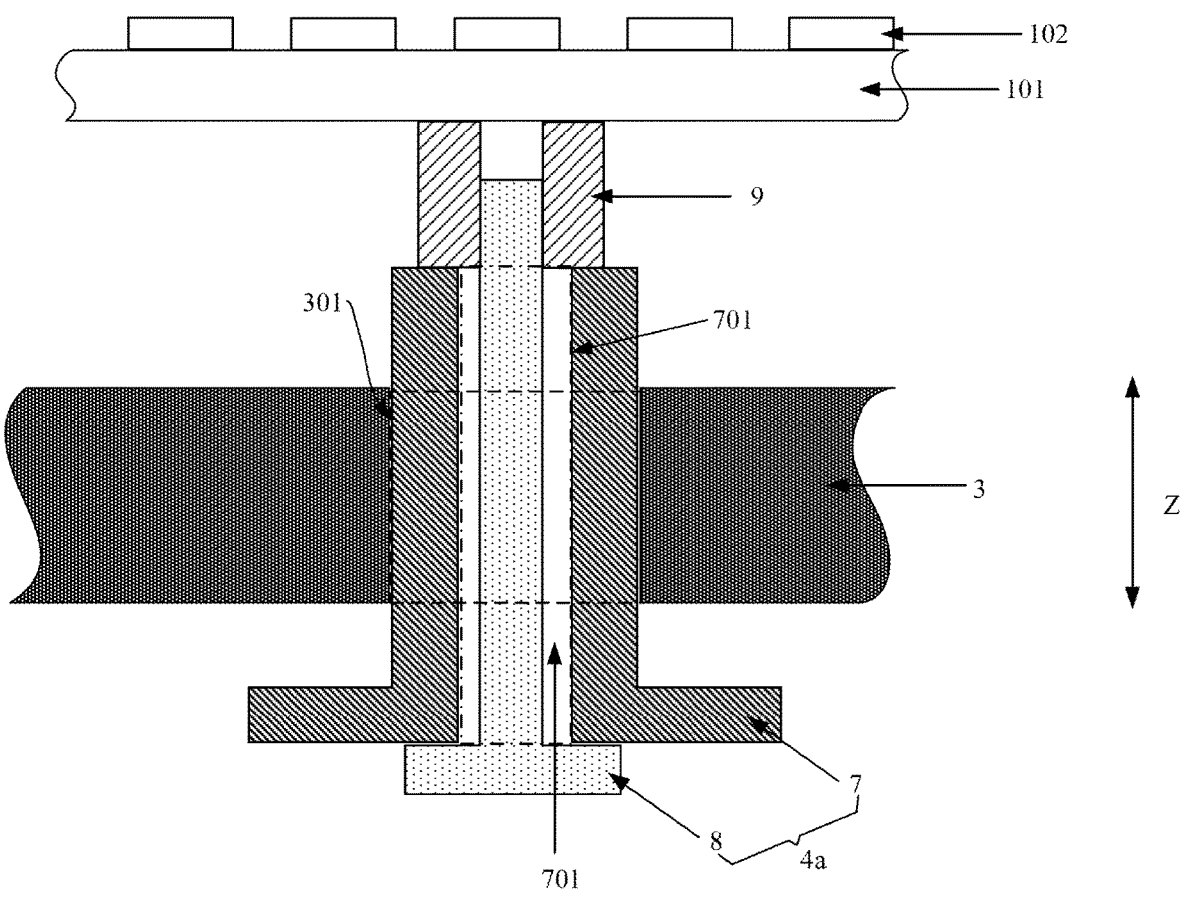
FIG. 4 is a schematic view showing a position adjusting structure according to the embodiments of the present disclosure.
Figure 5:
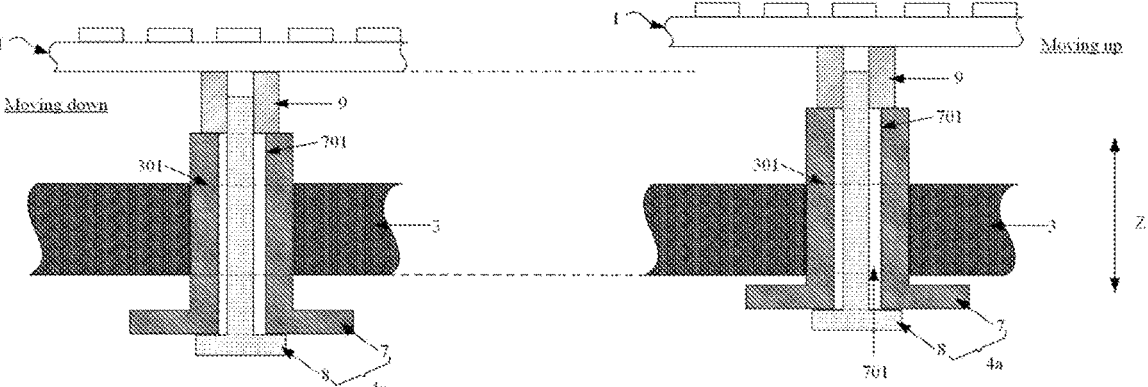
FIG. 5 is a schematic view showing controlling movement of the display substrate in a first direction through a first fine-adjusting structure according to the embodiments of the present disclosure.

FIG. 1 is a schematic view showing a structure of a display panel sub-assembly according to the embodiments of the present disclosure. FIG. 2 is a schematic view showing a mounting structure and a display substrate before assembly according to the embodiments of the present disclosure. FIG. 3 is a partial rear view of the mounting structure and the display substrate before assembly. FIG. 4 is a schematic view showing a position adjusting structure according to the embodiments of the present disclosure. FIG. 5 is a schematic view showing controlling movement of a display substrate in a first direction through a first fine-adjusting structure according to the embodiments of the present disclosure. As shown in FIGS. 1 to 5, the display panel sub-assembly includes: a display substrate 1 and a mounting structure 2. The mounting structure 2 includes: a base plate 3 and at least one position adjusting structure 4, the base plate 3 is arranged opposite to the display substrate 1, the position adjusting structure 4 extends through the base plate 3 and is connected to the display substrate 1, and the position adjusting structure 4 is configured to adjust a relative position between the display substrate 1 and the base plate 3.

In the embodiments of the present disclosure, after the display substrate 1 and the mounting structure 2 have been assembled, it is able to adjust the relative position between the display substrate 1 and the mounting structure 2 through the position adjusting structure 4 on the mounting structure 2, and the entire adjustment process does not require disassembly and secondary assembly of the assembled display substrate 1 and the mounting structure 2, so as to effectively improve the assembly efficiency of the tiled display apparatus and reduce a probability of damage to the display substrate 1.

In some embodiments, the display substrate 1 includes: a carrier substrate 101, a plurality of light-emitting elements 102 and at least one first connection member 9. The light-emitting elements 102 are secured to a side of the carrier substrate 101 away from the base plate 3, and the first connection member 9 is secured to a side of the carrier substrate 101 close to the base plate 3. The at least one position adjusting structure 4 corresponds to the at least one first connection members 9 respectively, and one position adjusting structure 4 is connected to a corresponding first connection members 9.

In the embodiment of the present disclosure, the carrier substrate 101 may be a printed circuit board of the FR4 (Flame Retardant 4) type (a flammability rating specified by American National Electrical Manufacturers Association (NEMA)), composed of an insulating board, a connection wire layer and a pad for assembling and soldering electronic elements (e.g., light-emitting elements, driving elements, sensing elements, etc.), the insulating board and the connecting wire layer may each have multiple layers, and the connecting wires at different layers may be connected by punching holes in the insulating board. As can be appreciated, a material of the carrier substrate 101 may also be glass, plastic, quartz, metal, etc., and the carrier substrate is provided with lines and pads for assembling and soldering electronic elements (such as light-emitting elements, mini LEDs or micro LEDs).

The light-emitting element 102 may be a micro light-emitting diode (Micro LED) or a mini light-emitting diode (Mini LED), and the Micro LED or the Mini LED may be mounted on a first side (generally referred to as a front side) of the carrier substrate 101 through die bonding process, and a circuit board is provided on a second side (generally referred to as a back side) of the carrier substrate 101 for applying electrical signals to the light-emitting elements on the first side.

In the embodiments of the present disclosure, the first connection member 9 is secured to the back side of the carrier substrate 101. In some embodiments, the first connection member 9 may be made of stainless steel, and a pad for soldering the first connection member 9 is reserved on the second side of the carrier substrate 101.

Still referring to FIGS. 4 and 5, in some embodiments, the position adjusting structure 4 includes: a first fine-adjusting structure 4a, the first fine-adjusting structure 4a is connected to a corresponding first connection member 9, and the first fine-adjusting structure 4a is configured to adjust a position of the display substrate 1 relative to the base plate 3 in a first direction Z, and the first direction Z is parallel to a normal line of the carrier substrate 101. That is, through the first fine-adjusting structure 4a, it is able to control the display substrate 1 to move in the first direction Z.

In some embodiments, at least one first through hole 301 corresponding to the at least one first fine-adjusting structure 4a respectively is formed on the base plate 3, and the first fine-adjusting structure 4a includes: an adjusting member 7 and a second connection member 8.

The adjusting member 7 has a hollow channel 701 extending in a first direction Z, at least a portion of the adjusting member 7 is located in the first through hole 301, an outer side wall of the adjusting member 7 is movably connected to an inner side wall of the corresponding first through hole 301, and the adjusting member 7 is configured to be movable in the first direction Z relative to the first through hole 301.

The second connection member 8 extends through the hollow channel 701, an end of the second connection member 8 close to the first connection member 9 is connected to the first connection member 9, an end of the second connection member 8 away from the first connection member 9 abuts against an end of the adjusting member 7 away from the first connection member 9, and the first connection member 9 abuts against an end of the adjusting member 7 close to the first connection member 9.

In the embodiments of the present disclosure, the second connection member 8 extends through the hollow channel 701 of the adjusting member 7 and is connected to the corresponding first connection member 9, and one end of the first connection member 9 close to the adjusting member 7 and one end of the second connection member 8 away from the first connection member 9 respectively abut against two ends of the adjusting member 7, namely, while the second connection member 8 and the first connection member 9 are secured to each other, they also clamp and fix the adjusting member 7 in the first direction Z. In a process where the adjusting member 7 is adjusted to move in the first direction Z relative to the first through hole, the first connection member 9 and the display substrate 1 fixedly connected to the first connection member 9 are synchronously driven to move in the first direction Z relative to the base plate 3, so as to adjust a position of the display substrate 1 in the first direction Z relative to the base plate 3.

In some embodiments, the first through hole 301 is a first threaded hole, and the adjusting member 7 includes: a hollow screw, an external thread of the hollow screw matching an internal thread of the corresponding first threaded hole, the hollow screw being movable in the first direction Z by rotation in the first threaded hole. That is, the hollow screw may be rotated to move in the first direction Z, thereby driving the display substrate 1 to synchronous move in the first direction Z.

In some embodiments, the first connection member 9 includes: a connection pillar, one end of the connection pillar close to the carrier substrate 101 is secured to the carrier substrate 101, and one end of the connection pillar away from the carrier substrate 101 is formed with a second threaded hole.

The second connection member 8 includes: a first screw, an external thread of the first screw matches an internal thread of the corresponding second threaded hole. An area of a pan head of the first screw in a cross section parallel to the plane in which the base plate 3 lies is greater than an area of the hollow channel 701 in a cross section parallel to the plane in which the base plate 3 lies, and the pan head of the first screw abuts against one end of the adjusting member 7 away from the connection pillar. An area of a shank of the first screw in a cross-section parallel to the plane in which the base plate 3 lies is smaller than the area of the hollow channel 701 in the cross-section parallel to the plane in which the base plate 3 lies, the shank of the first screw penetrates through the hollow channel 701, and an end of the shank of the first screw away from the first screw is threadedly connected to the corresponding connection pillar. By rotating the pan head of the first screw, the first screw may be moved in the first direction Z.

It should be noted that a case where the above-mentioned second connection member 8 is a screw, the first connection member 9 is provided with a threaded hole, and the first connection member 9 and the second connection member 8 are secured to each other in a threaded manner, is merely an optional embodiment of the present disclosure and does not limit the technical solution of the present disclosure. In practical applications, the first connection member 9 and the second connection member 8 may also be secured to each other in other ways, such as in a direct snap-fit manner.

It should be noted that in the embodiments of the present disclosure, a plurality of position adjusting structures 4 may be provided on the base plate 3, the plurality of position adjusting structures 4 is arranged at different positions, and distances of different regions on a single display substrate 1 relative to the base plate 3 may be adjusted by adjusting the first fine-adjusting structures 4a of the position adjusting structures 4 located at the different positions, so as to adjust the flatness of the single display substrate 1. In the related art, the flatness of a single display substrate 1 in a display panel sub-assembly is generally greater than 0.1 mm. However, in the present application, the flatness of the single display substrate 1 may be made less than 0.05 mm by the adjustment of the first fine-adjusting structure 4a. As can be appreciated, when the flatness of the single display substrate 1 is less than 0.05 mm, it means that a normal direction of the carrier substrate 101 is substantially perpendicular to the plane where the base plate 3 lies, e.g., an angle between the normal direction of the carrier substrate 101 and the plane where the base plate 3 lies is between 87° and 93°.

Figures 6, 7:
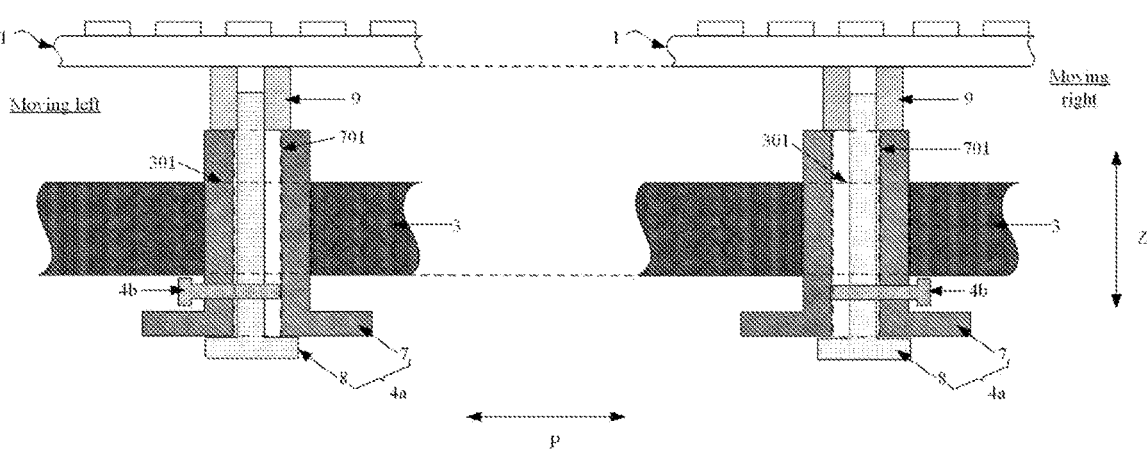
FIG. 6 is another schematic view showing the position adjusting structure according to the embodiments of the present disclosure.
FIG. 7 is a schematic view showing controlling movement of the display substrate in a direction parallel to a plane in which a carrier substrate is located through a second fine-adjusting structure according to the embodiments of the present disclosure.

FIG. 6 is another schematic view showing the position adjusting structure according to the embodiments of the present disclosure. FIG. 7 is a schematic view showing controlling movement of the display substrate in a direction parallel to a plane in which a carrier substrate is located through a second fine-adjusting structure according to the embodiments of the present disclosure. As shown in FIGS.

6 and 7, the position adjusting structure 4 shown in FIG. 6 includes not only the first fine-adjusting structure 4a in the previous embodiments but also a second fine-adjusting structure 4b. Only the second fine-adjusting structure 4b is described in detail below.

The second fine-adjusting structure 4b is connected to the corresponding second connection member 8, and the second fine-adjusting structure 4b is configured to adjust the second connection member 8 to move along a corresponding second direction P so as to adjust the position of the display substrate 1 relative to the base plate 3 in the second direction P. The second direction P is parallel to a plane in which the carrier substrate 101 lies. When the second fine-adjusting structure 4b is used to adjust the second connection member 8 to move in the corresponding second direction P, the first connection member 9 secured to the second connection member 8 and the display substrate 1 secured to the first connection member 9 may be driven to move synchronously in the second direction P. That is, the display substrate 1 may be controlled to move in the second direction P through the second fine-adjusting structure 4b.

Each second fine-adjusting structure 4b corresponds to a second direction P parallel to the plane where the carrier substrate 101 lies, and the second directions P corresponding to different second fine-adjusting structures 4b may be the same or different, which will be described in detail in conjunction with specific examples later.

In some embodiments, a second through hole 702 is formed in a portion of a side wall of the adjusting member 7 on the side of the base plate 3 away from the display substrate 1, and the second fine-adjusting structure 4b passes through the corresponding second through hole 702 and is connected to the portion of the second connection member 8 located in the hollow channel 701.

Further, optionally, the portion of the second connection member 8 located inside the hollow channel 701 is formed with a third threaded hole 803 arranged opposite to the second through hole 702 in the corresponding second direction P. The second fine-adjusting structure 4b includes: a second screw, an external thread of the second screw matches the internal thread of the corresponding third threaded hole 803, and a pan head of the second screw is located outside the side wall of the adjusting member 7. An area of a shank of the second screw in a cross section perpendicular to the corresponding second direction P is smaller than an area of the second through hole 702 in a cross section perpendicular to the corresponding second direction P, the shank of the second screw passes through the second through hole 702 and is threadedly connected to the third threaded hole 803, and the second screw is capable of driving the second connection member 8 to move in the second direction P by rotating in the third threaded hole 803. That is to say, by rotating the second screw, it allows the second connection member 8 threadedly connected to the second screw to move in the corresponding second direction P (which may specifically be the first screw hole in the foregoing), and when the second connection member 8 moves in the second direction P, the first connection member 9 secured to the second connection member 8 and the display substrate 1 secured to the first connection member 9 may be driven to move synchronously in the second direction P. In some embodiments, the second through hole 702 does not have the internal thread and the second screw is not in threaded connection with the second through hole 702.

In some embodiments, the third threaded hole 803 may not be provided or may be provided as a blind hole, and the second through hole 702 may be provided as a threaded hole to which the second screw is threadedly connected. In this case, through rotating the second screw, it allows the second screw to move in the second direction P relative to the second through hole 702, thereby pushing the second connection member 8 to move in the second direction P. When the second connection member 8 moves in the second direction P, the first connection member 9 secured to the second connection member 8 and the display substrate 1 secured to the first connection member 9 may be driven to move synchronously in the second direction P.

In some embodiments, the quantity of second fine-adjusting structures 4*b* is multiple, and the second directions P corresponding to at least two second fine-adjusting structures 4*b* are different directions.

In some embodiments, the base plate 3 has a first side edge, a second side edge, a third side edge and a fourth side edge. The first side edge and the second side edge are oppositely arranged in a third direction, the first side edge and the second side edge extend in a fourth direction, the third side edge and the fourth side edge are oppositely arranged in the fourth direction, and the third side edge and the fourth side edge extend in the third direction. Both the third direction and the fourth direction are parallel to the plane where the carrier substrate 101 is located, and the third direction crosses the fourth direction.

The second direction corresponding to the one or more of the second fine-adjusting structures 4*b* closest to the first side edge is the third direction, and/or, the second direction corresponding to one or more of the second fine-adjusting structures 4*b* closest to the second side edge is the third direction, and/or, the second direction corresponding to one or more of the second fine-adjusting structures 4*b* closest to the third side edge is the fourth direction, and/or, the second direction corresponding to one or more of the second fine-adjusting structures 4*b* closest to the fourth side edge is the fourth direction. In some embodiments, one or more of the second fine-adjusting structures 4*b* closest to the first side edge cooperate with one or more of the second fine-adjusting structures 4*b* closest to the second side edge to adjust the movement of the display substrate 1 in the third direction. In some embodiments, one or more of the second fine-adjusting structures 4*b* closest to the third side edge cooperate with one or more of the second fine-adjusting structures 4*b* closest to the fourth side edge to adjust the movement of the display substrate 1 in the fourth direction.

Figure 8:
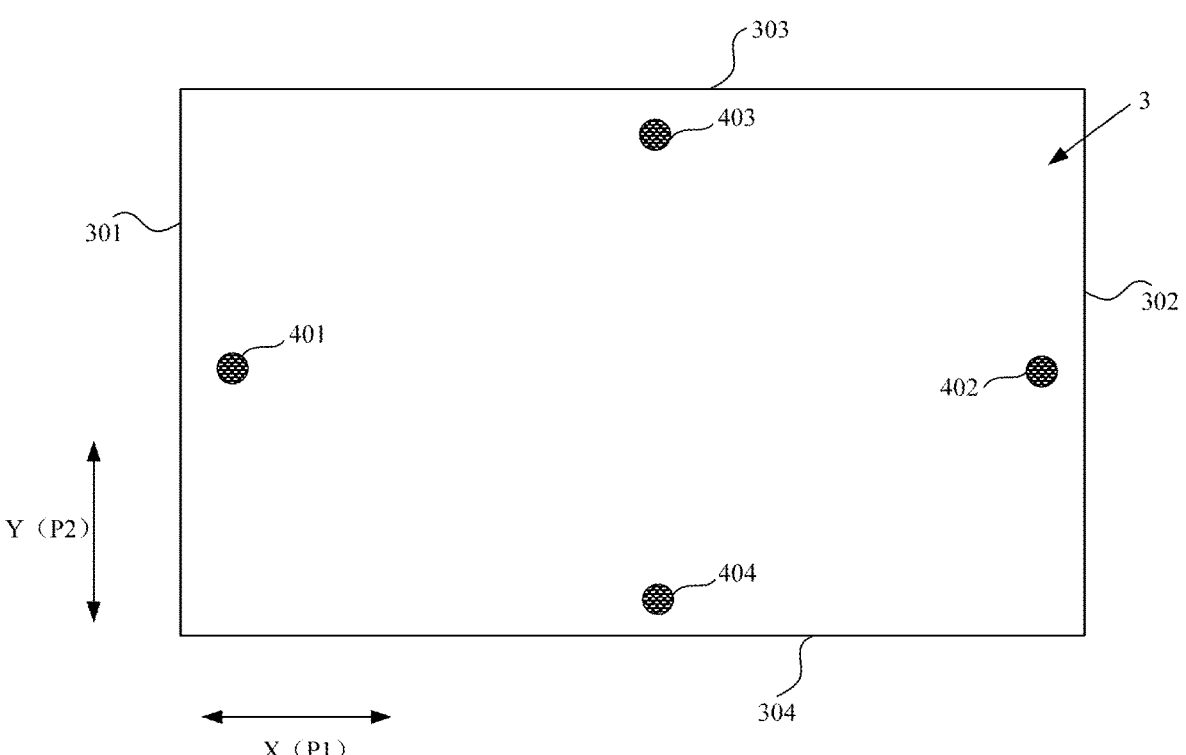
FIG. 8 is a schematic view showing a distribution of multiple position adjusting structures according to the embodiments of the present disclosure.

FIG. 8 is a schematic view showing a distribution of multiple position adjusting structures according to the embodiments of the present disclosure. As an alternative FIG. 8, as an optional example, four position adjusting structures 4 are provided on the base plate 3 at positions close to a midpoint of the first side edge 301, close to a midpoint of the second side edge 302, close to a midpoint of the third side edge 303, and close to a midpoint of the fourth side edge 304.

The second direction P1 corresponding to the second fine-adjusting structure 4*b* in the position adjusting structure 401 close to the middle point of the first side edge 301 is a third direction X (a horizontal direction in FIG. 8), the second direction P1 corresponding to the second fine-adjusting structure 4*b* in the position adjusting structure 402 close to the middle point of the second side edge 302 is the third direction X (the horizontal direction in FIG. 8), the second direction P2 corresponding to the second fine-adjusting structure 4*b* in the position adjusting structure 403 close to the middle point of the third side edge 303 is a fourth direction Y (a vertical direction in FIG. 8), and the second direction P2 corresponding to the second fine-adjusting structure 4*b* in the position adjusting structure 404 close to the midpoint of the fourth side 304 is the fourth direction Y (the vertical direction in FIG. 8).

Namely, the display substrate 1 may be controlled to move toward at least one side in the third direction X through at least one of the second fine-adjusting structure 4*b* in the position adjusting structure 401 close to the midpoint of the first side edge 301 or the second fine-adjusting structure 4*b* in the position adjusting structure 402 close to the midpoint of the second side edge 302. The display substrate 1 may be controlled to move towards at least one side in the fourth direction Y through at least one of the second fine-adjusting structure 4*b* in the position adjusting structure 403 close to the midpoint of the third side 303 or the second fine-adjusting structure 4*b* in the position adjusting structure 404 close to the midpoint of the fourth side 304.

With the above arrangement, it is able to control the relative position of the display substrate 1 relative to the base plate 3 in the third direction X and the fourth direction Y. In the embodiments of the present disclosure, the second direction corresponding to the second fine-adjusting structure in the position adjusting structure may not be the above-mentioned third direction X and fourth direction Y, but a direction crossing both the third direction X and the fourth direction Y, and a particular case of which may be adjusted according to actual needs.

Figure 9:
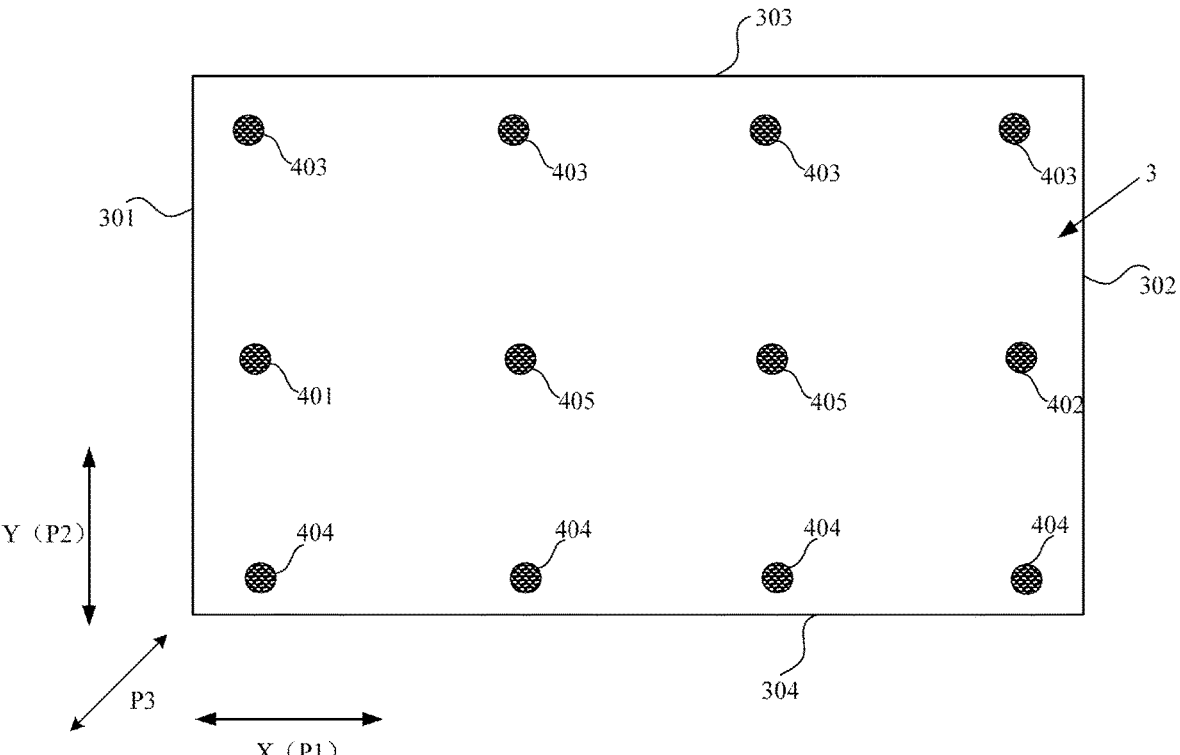
FIG. 9 is another schematic view showing the distribution of multiple position adjusting structures according to the embodiments of the present disclosure.

FIG. 9 is another schematic view showing the distribution of multiple position adjusting structures according to the embodiments of the present disclosure. As shown in FIG. 9, in some embodiments, there are twelve position adjusting structures arranged in a three-row, four-column array on the base plate 3.

The second direction P1 corresponding to the second fine-adjusting structure 4*b* in one position adjusting structure 401 closest to the first side edge 301 is the third direction X, the second direction P1 corresponding to the second fine-adjusting structure 4*b* in one position adjusting structure 402 closest to the second side edge 302 is the third direction X, the second direction P2 corresponding to the second fine-adjusting structures 4*b* in the four position adjusting structures 403 closest to the third side edge 303 is the fourth direction Y, and the second direction P2 corresponding to the second fine-adjusting structures 4*b* in the four position adjusting structures 404 closest to the fourth side edge 304 is the fourth direction Y.

Two position adjusting structures 405 located in the center portion may include only the first fine-adjusting structure 4*a* but not the second fine-adjusting structure 4*b*. Alternatively, the two position adjusting structures 405 located in the center portion may include the second fine-adjusting structure 4*b*, and a second direction P3 (for example, the second direction P3 shown in FIG. 9 crossing both the third direction X and the fourth direction Y) corresponding to the second fine-adjusting structures 4*b* in the two position adjusting structures 405 may be preset according to actual needs.

Note that, in the embodiments of the present disclosure, the quantity and arrangement of the position adjusting structures are not limited.

In the embodiments of the present disclosure, the position of the display substrate in the direction parallel to the normal line of the base plate may be adjusted through the first fine-adjusting structure in the position adjusting structure, so as to realize that the flatness of the single display substrate is less than 0.05 mm, and the flatness between adjacent display substrates is less than 0.05 mm. In addition, by means of the second fine-adjusting structure within the position adjusting structure, it is able to realize that a pitch between adjacent display substrates is less than or equal to 0.05 min.

In the related art, in order to realize the alignment between the display panel sub-assembly and the bearing housing, an aluminum locating pin is generally provided on the display panel sub-assembly, and a corresponding locating hole is provided in the bearing housing, and the alignment between the display panel sub-assembly and the bearing housing is achieved through the cooperation of the aluminum locating pin and the locating hole. In the related art, the aluminum locating pin is generally formed integrally with the aluminum base plate and are inseparable.

However, in practical applications, it has been found that as a tiled size becomes larger, due to manufacturing tolerances of the structural components, the larger the tiled size, the more tolerance accumulation, and when a large screen is spliced and assembled to a certain size, there is a problem that the display panel sub-assembly cannot be assembled together with the bearing housing. It has been found that, due to excessive tolerance accumulation, the aluminum locating pin in the display panel sub-assembly could not be installed into the corresponding locating hole in the bearing housing, which results in that the display panel sub-assembly could not be assembled with the bearing housing.

Figure 10:
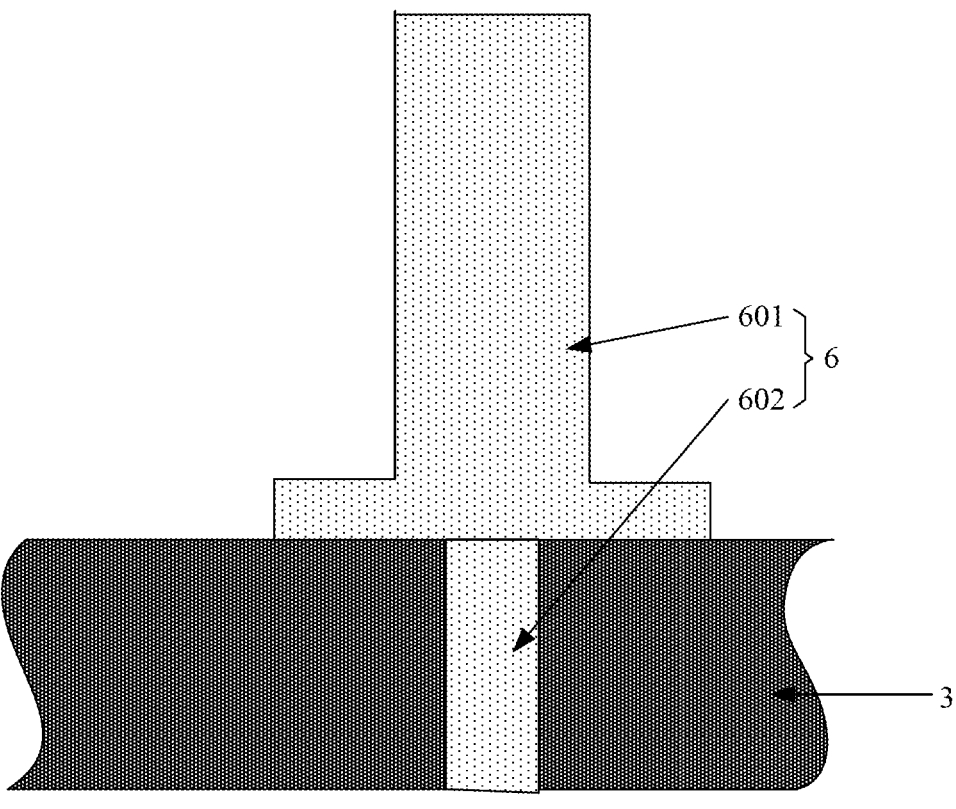
FIG. 10 is a schematic view showing a locating pin according to the embodiments of the present disclosure.

In order to effectively solve the above technical problem, the present disclosure provides a corresponding solution. FIG. 10 is a schematic view showing a structure of a locating pin according to the embodiments of the present disclosure. As shown in FIG. 10, in some embodiments, the display panel sub-assembly further includes: at least one locating pin 6 located on a side of the base plate 3 away from the display substrate 1 and detachably connected to the base plate 3, the locating pin 6 is configured to cooperate with a locating hole in the bearing housing so as to align and assemble the display panel sub-assembly and the bearing housing.

In the embodiments of the present disclosure, since the locating pin 6 is secured to the base plate 3 in a detachable manner, when the locating pin 6 of the display panel sub-assembly cannot be mounted into a corresponding locating hole in the bearing housing due to excessive tolerance accumulation, it only requires to detach the locating pin 6 from the base plate 3, so as to ensure that the assembly and splicing may be continued.

In some embodiments, the locating pin 6 includes: a locating pin body 601 and a shank 602 connected to the locating pin body 601. At least one fourth threaded hole corresponding to the at least one locating pin respectively is formed on the base plate 3, and an internal thread of the fourth threaded hole matches an external thread of the shank 602 of the corresponding locating pin 6. That is, when the locating pin is not needed, it only requires to separate the shank 602 in the locating pin 6 from the fourth threaded hole by rotating the locating pin body.

In some embodiments, a material of the locating pin 601 includes plastic. In the embodiments of the present disclosure, when the quantity of display panel sub-assemblies spliced in a certain direction reaches a certain quantity, the splicing tolerance may be accumulated in an additive manner. while the plastic is soft and the friction resistance is small, the display panel sub-assemblies may still be assembled in alignment with the bearing housing, and in a case where a certain display panel sub-assembly cannot be assembled in alignment with the bearing housing, the locating pin 6 on the display panel sub-assembly may be detached from the base plate 3, thereby to ensure that the assembly and splicing is continued.

Note that in the embodiments of the present disclosure, the quantity of locating pins arranged on the base plate may be one or more. The technical solution of the present disclosure does not define the quantity and arrangement of the locating pins.

Figure 11:
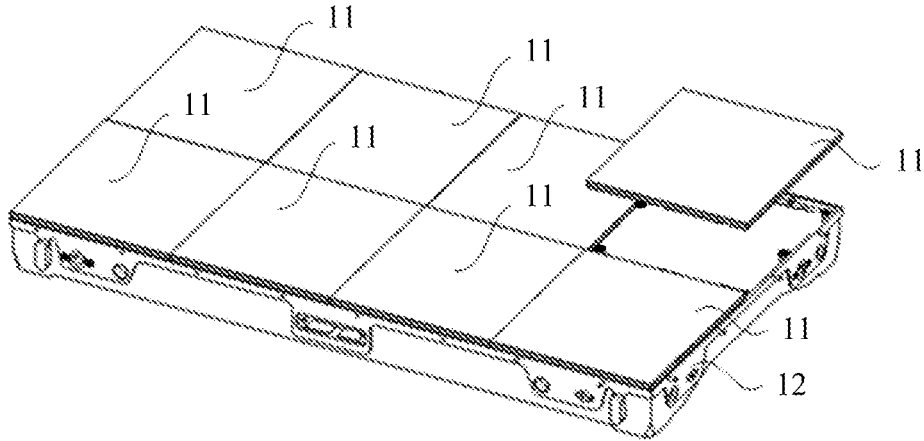
FIG. 11 is a schematic view showing a tiled display apparatus according to the embodiments of the present disclosure.

Based on the same concept, the embodiments of the present disclosure further provide a tiled display apparatus. FIG. 11 is a schematic view showing a tiled display apparatus according to the embodiments of the present disclosure. As shown in FIG. 11, the tiled display apparatus includes: a plurality of display panel sub-assemblies 11, at least one of the display panel sub-assemblies 11 is the display panel sub-assembly provided in the previous embodiments. For a detailed description of the display panel sub-assembly 11, reference is made to the contents of the previous embodiments, which will not be repeated herein.

In some embodiments, the tiled display apparatus further includes: a bearing housing 12, and the bearing housing 12 is configured to bear the plurality of display panel sub-assemblies 11.

It should be noted that in the present disclosure, relational terms such as first and second are used only to distinguish one entity or operation from another entity or operation, and do not necessarily require or imply that there is any such actual relationship or order between the entities or operations. Moreover, a term "include", "have" or any other variation thereof are intended to encompass non-exclusive inclusion, such that a process, method, product or device including a series of elements includes not only those elements, but also other elements not explicitly listed, or elements inherent to the process, method, product or device. Without more restrictions, an element defined by an expression "including a . . . " does not exclude the existence of other identical elements in the process, method, product or device including the element.

In accordance with the embodiments of the present disclosure as set forth above, these embodiments are not intended to be exhaustive or to limit the present disclosure to be only the specific embodiments described above. Apparently, many modifications and variations are possible in light of the above teaching. The embodiments are chosen and described in detail to better explain the principle and practical applications of the present disclosure, thereby to enable a person skilled in the art to well utilize the present disclosure and utilize the present disclosure with various modifications. The present disclosure is limited only by the claims and the entire scope and equivalents thereof.

What is claimed is:

1. A display panel sub-assembly, comprising:
a display substrate; and
a mounting structure comprising a base plate disposed opposite to the display substrate and at least one position adjusting structure extending through the base plate and connected to the display substrate, the at least one position adjusting structure being configured to adjust a relative position between the display substrate and the base plate, wherein:
the display substrate comprises a carrier substrate, a plurality of light-emitting elements and at least one first connection member;
the light-emitting elements are secured to a side of the carrier substrate away from the base plate, and the first connection member is secured to a side of the carrier substrate close to the base plate;

the at least one position adjusting structure corresponds to the at least one first connection member respectively, and one position adjusting structure is connected to a corresponding first connection member;

the at least one position adjusting structure comprises at least one first fine-adjusting structure; each first fine-adjusting structure is connected to a corresponding first connection member configured to adjust a position of the display substrate relative to the base plate in the first direction, and the first direction is parallel to a normal of the carrier substrate;

the base plate has at least one first through hole corresponding to the at least one first fine-adjusting structure respectively; and each first fine-adjusting structure comprises an adjusting member and a second connection member; at least a portion of the adjusting member is located in a corresponding first through hole, the adjusting member is configured to be movable relative to the corresponding first through hole in a first direction, and the adjusting member has a hollow channel extending in the first direction; the second connection member extends through the hollow channel.

2. The display panel sub-assembly according to claim 1, wherein an outer side wall of the adjusting member is movably connected to an inner side wall of the corresponding first through hole;

the second connection member is connected to the first connection member at an end of the second connection member close to the first connection member, an end of the second connection member away from the first connection member abuts against an end of the adjusting member away from the first connection member, and the first connection member abuts against an end of the adjusting member close to the first connection member.

3. The display panel sub-assembly according to claim 2, wherein the first connection member comprises: a connection pillar, wherein one end of the connection pillar close to the carrier substrate is secured to the carrier substrate, and one end of the connection pillar away from the carrier substrate is formed with a second threaded hole;

the second connection member comprises: a first screw having an external thread matching an internal thread of the second threaded hole;

an area of a pan head of the first screw in a cross section parallel to a plane in which the base plate lies is greater than an area of the hollow channel in a cross section parallel to the plane in which the base plate lies, and the pan head of the first screw abuts against an end of the adjusting member away from the connection pillar;

an area of a shank of the first screw in a cross section parallel to the plane in which the base plate lies is smaller than the area of the hollow channel in the cross section parallel to the plane in which the base plate lies, the shank of the first screw penetrates the hollow channel, and an end of the shank of the first screw away from the first screw is threadedly connected to the corresponding connection pillar.

4. The display panel sub-assembly according to claim 2, wherein the at least one position adjusting structure further comprises:

at least one second fine-adjusting structure, each second fine-adjusting structure being connected to a corresponding second connection member and configured to adjust the second connection member to move along a corresponding second direction so as to adjust the position of the display substrate relative to the base plate in the second direction;

wherein the second direction is parallel to a plane in which the carrier substrate lies.

5. The display panel sub-assembly according to claim 4, wherein a second through hole is in a portion of a side wall of the adjusting member on a side of the base plate away from the display substrate;

the second fine-adjusting structure passes through the second through hole and is connected to a portion of the second connection member within the hollow channel.

6. The display panel sub-assembly according to claim 5, wherein the portion of the second connection member located in the hollow channel is formed with a third threaded hole arranged opposite to the second through hole in the second direction;

the second fine-adjusting structure comprises: a second screw having an external thread matching an internal thread of the third threaded hole;

a pan head of the second screw is located outside the side wall of the adjusting member;

an area of a shank of the second screw in a cross section perpendicular to the second direction is smaller than an area of the second through hole in a cross section perpendicular to the second direction, the shank of the second screw passes through the second through hole and is in threaded connection with the third threaded hole, and the second screw is capable of driving the second connection member to move in the second direction by rotating in the third threaded hole.

7. The display panel sub-assembly according to claim 4, wherein the at least one second fine-adjusting structure comprises a plurality of second fine-adjusting structures;

second directions corresponding to at least two of the second fine-adjusting structures in the plurality of second fine-adjusting structures are different directions.

8. The display panel sub-assembly according to claim 7, wherein the base plate has a first side edge, a second side edge, a third side edge and a fourth side edge;

the first side edge and the second side edge are oppositely arranged in a third direction, the first side edge and the second side edge extend in a fourth direction, the third side edge and the fourth side edge are oppositely arranged in the fourth direction, and the third side edge and the fourth side edge extend in the third direction;

both the third direction and the fourth direction are parallel to the plane where the carrier substrate lies, and the third direction crosses the fourth direction;

the second direction corresponding to one or more of the second fine-adjusting structures closest to the first side edge is the third direction; and/or, the second direction corresponding to one or more of the second fine-adjusting structures closest to the second side edge is the third direction; and/or, the second direction corresponding to one or more of the second fine-adjusting structures closest to the third side edge is the fourth direction; and/or, the second direction corresponding to the one or more second fine-adjusting structures closest to the fourth side edge is the fourth direction.

9. The display panel sub-assembly according to claim 1, wherein the first through hole is a first threaded hole;

the adjusting member comprises a hollow screw having an external thread matching an internal thread of a corresponding first threaded hole, the hollow screw being movable in the first direction by rotation in the first threaded hole.

10. The display panel sub-assembly according to claim 9, wherein the at least one position adjusting structure further comprises:

at least one second fine-adjusting structure, each second fine-adjusting structure being connected to a corresponding second connection member and configured to adjust the second connection member to move along a corresponding second direction so as to adjust the position of the display substrate relative to the base plate in the second direction;

wherein the second direction is parallel to a plane in which the carrier substrate lies.

11. The display panel sub-assembly according to claim 1, further comprising:

at least one locating pin located on a side of the base plate away from the display substrate and detachably connected to the base plate, wherein the at least one locating pin is configured to cooperate with at least one locating hole in a bearing housing, to align and assemble the display panel sub-assembly and the bearing housing.

12. The display panel sub-assembly according to claim 11, wherein each of the at least one locating pin comprises: a locating pin body and a shank connected to the locating pin body;

at least one threaded hole, corresponding to the at least one locating pin respectively, is in the base plate, and an internal thread of each threaded hole matches an external thread of the shank of the corresponding locating pin.

13. The display panel sub-assembly according to claim 12, wherein a material of the locating pin body comprises plastic.

14. A tiled display apparatus comprising a plurality of display panel sub-assemblies, wherein at least one of the display panel sub-assemblies is the display panel sub-assembly according to claim 1.

15. The tiled display apparatus according to claim 14, further comprising:

a bearing housing configured to bear the plurality of display panel sub-assemblies.

16. The tiled display apparatus according to claim 14, wherein an outer side wall of the adjusting member is movably connected to an inner side wall of the corresponding first through hole;

the second connection member is connected to the first connection member at an end of the second connection member close to the first connection member, an end of the second connection member away from the first connection member abuts against an end of the adjusting member away from the first connection member, and the first connection member abuts against an end of the adjusting member close to the first connection member;

the first through hole is a first threaded hole; and the adjusting member comprises a hollow screw having an external thread matching an internal thread of a corresponding first threaded hole, the hollow screw being movable in the first direction by rotation in the first threaded hole.

17. A display panel sub-assembly, comprising:

a display substrate; and a mounting structure comprising a base plate disposed opposite to the display substrate and at least one position adjusting structure extending through the base plate and connected to the display substrate, the at least one position adjusting structure being configured to adjust a relative position between the display substrate and the base plate, wherein:

the at least one position adjusting structure comprises: at least one first fine-adjusting structure and at least one second fine-adjusting structure;

the base plate has at least one first through hole corresponding to the at least one first fine-adjusting structure respectively;

each first fine-adjusting structure comprises an adjusting member and a second connection member; at least a portion of the adjusting member is located in a corresponding first through hole, the adjusting member is configured to be movable relative to the corresponding first through hole in a first direction, and the adjusting member has a hollow channel extending in the first direction; the second connection member extends through the hollow channel;

a second through hole is in a portion of a side wall of the adjusting member on a side of the base plate away from the display substrate;

the second fine-adjusting structure passes through the second through hole and is connected to a portion of the second connection member within the hollow channel;

the portion of the second connection member located in the hollow channel is formed with a third threaded hole arranged opposite to the second through hole in the second direction;

the second fine-adjusting structure comprises: a second screw having an external thread matching an internal thread of the third threaded hole;

a pan head of the second screw is located outside the side wall of the adjusting member; and an area of a shank of the second screw in a cross section perpendicular to the second direction is smaller than an area of the second through hole in a cross section perpendicular to the second direction, the shank of the second screw passes through the second through hole and is in threaded connection with the third threaded hole, and the second screw is capable of driving the second connection member to move in the second direction by rotating in the third threaded hole.

\* \* \* \* \*